US008941244B1

(12) United States Patent
Tsai et al.

(10) Patent No.: US 8,941,244 B1
(45) Date of Patent: Jan. 27, 2015

(54) SEMICONDUCTOR DEVICE AND MANUFACTURING METHOD THEREOF

(71) Applicant: Taiwan Semiconductor Manufacturing Company Ltd., Hsinchu (TW)

(72) Inventors: Po-Hao Tsai, Taoyuan County (TW); Jui-Pin Hung, Hsinchu (TW); Jing-Cheng Lin, Hsinchu County (TW); Long-Hua Lee, Taipei (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 13/935,064

(22) Filed: Jul. 3, 2013

(51) Int. Cl.
*H01L 23/48* (2006.01)
*H01L 23/50* (2006.01)
*H01L 29/40* (2006.01)
*H01L 21/768* (2006.01)

(52) U.S. Cl.
CPC ........ *H01L 23/481* (2013.01); *H01L 21/76879* (2013.01)

USPC .......... 257/774; 257/664; 257/788; 438/667; 438/669

(58) Field of Classification Search
USPC .......... 257/664, 775, 788, 789; 438/667, 669
See application file for complete search history.

(56) References Cited

U.S. PATENT DOCUMENTS

| 7,944,038 B2 * | 5/2011 | Chiu et al. | 257/690 |
| 2009/0039523 A1 * | 2/2009 | Jiang et al. | 257/777 |
| 2013/0119560 A1 * | 5/2013 | Toh et al. | 257/774 |
| 2014/0110841 A1 * | 4/2014 | Beer et al. | 257/738 |
| 2014/0131858 A1 * | 5/2014 | Pan et al. | 257/737 |

* cited by examiner

*Primary Examiner* — Phuc Dang
(74) *Attorney, Agent, or Firm* — WPAT, P.C.; Anthony King

(57) ABSTRACT

A semiconductor structure includes a molding compound, a conductive plug, and a cover. The conductive plug is in the molding compound. The cover is over a top meeting joint between the conductive plug and the molding compound. The semiconductor structure further has a dielectric. The dielectric is on the cover and the molding compound.

19 Claims, 15 Drawing Sheets

SEMICONDUCTOR DEVICE AND MANUFACTURING METHOD THEREOF

FIELD

The disclosure relates to a semiconductor device, and more particularly to a three dimensional integrated fan out package.

BACKGROUND

Semiconductor device is widely adopted in various applications. The geometry is trending down rapidly as user's demands increases on the performance and functionality. For example, a 3G mobile phone presented in the market is expected to be capable of telecommunicating, capturing images and processing high stream data. In order to fulfill the requirements, the 3G mobile phone needs to be equipped with different devices such as a processor, a memory and an image sensor in a limited space.

Combining several semiconductor devices in one package is one of the approaches to enhance the performance by integrating devices with various functions into a single component. Roadmap in the field shows a three dimensional package with a multi-level structure for a superior and miniature sized semiconductor component.

A three dimensional integrated semiconductor package contains several different sub-structures. The sub-structures are arranged in a stack manner and are either in contact with each other or linked by interconnects. However, on the other hand, different properties of the sub-structures also create challenges to a designer. Compared to a two dimensional semiconductor package, failure modes increase for a comparatively more complex three dimensional integrated semiconductor package. As such, improvements in the structure and method for a three dimensional semiconductor package continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

In the present disclosure, a three dimensional (3D) semiconductor structure or package is designed to prevent an in-film crack propagating in the structure of the package. The semiconductor structure or package is an integrated component and includes various materials with different coefficient of thermal expansion (CTE). A CTE difference between a conductor and surrounding dielectric, usually a molding compound, can cause a crack to develop during subsequent processing. Such crack has been found to propagate through overlying layers and may cause an overlying conductor to also crack or to weaken, causing an open circuit during manufacturing or product operation. An undesired open circuit can result in a failure of the product. Thus, improved structure to prevent such in-film crack from propagating to overlying layers is developed.

According to various embodiments, the 3D semiconductor structure includes thin film layers to prevent a crack from an interface of a conductive post and surrounding molding compound from causing a crack to an overlying conductor. This thin film layers protect an embedded semiconductor chip and some interconnects. The thin film layers are also referred to as dividers and covers and are disposed on a certain interface prone to cracking to prevent a propagation of a crack generated therein.

Figure 1:
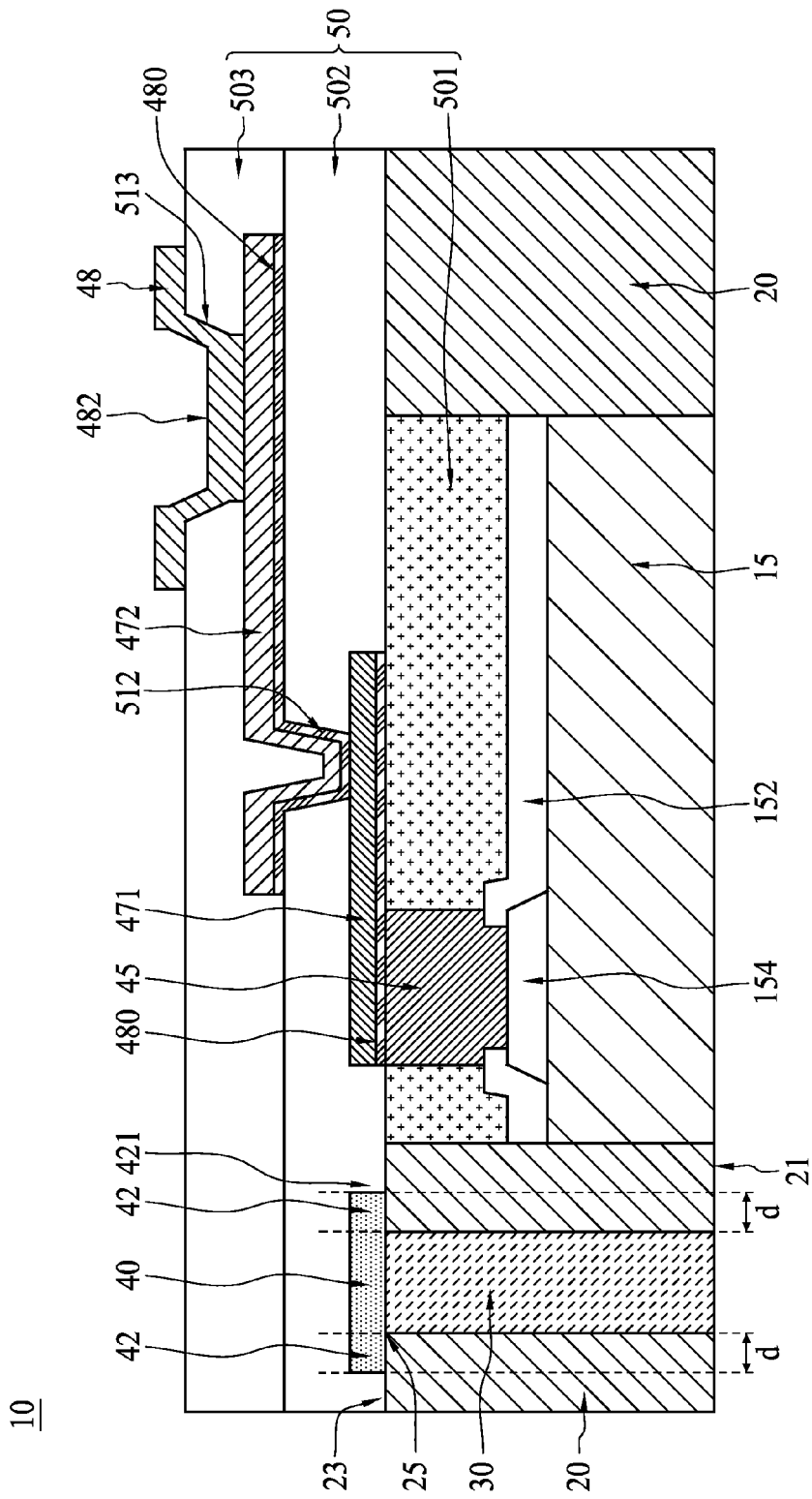
FIG. 1 is a schematic of a three dimensional semiconductor structure.

FIG. 1 is a 3D semiconductor structure 10. The 3D semiconductor structure 10 has a semiconductor chip 15 disposed at the bottom of the structure 10. On the sidewalls of the semiconductor chip 15, molding compound 20 surrounds the semiconductor chip 15. The 3D semiconductor structure 10 has a conductive plug 30 in the molding compound 20 and the conductive plug 30 runs through the molding compound 20.

The semiconductor chip 15 has a passivation 152. The passivation 152 is formed with dielectric materials, such as spin-on glass (SOG), silicon oxide, silicon oxynitride, silicon nitride or the like. The semiconductor chip 15 has a bond pad 154 on its top surface. An opening in the passivation is provided in order to expose a portion of the bond pad 154.

The molding compound 20 can be a single layer film or a composite stack. It includes various materials, for example, one or more of epoxy resins, phenolic hardeners, silicas, catalysts, pigments, mold release agents, and the like. Material for forming a molding compound has a high thermal conductivity, a low moisture absorption rate, a high flexural strength at board-mounting temperatures, or a combination of these.

In some embodiments, the 3D semiconductor structure 10 has a polymer buffer layer (not shown in FIG. 1) and the polymer buffer layer is at the bottom of the molding compound 20.

The conductive plug 30 has one end at a top surface 23 of the molding compound 20 and the other end at a bottom surface 21 of the molding compound 20. In some embodiments, a conductive plug is a via filled with a conductive material. The conductive material for the filled via or the conductive plug is formed with gold, silver, copper, nickel, tungsten, aluminum, tin and/or alloys thereof.

A top meeting joint 25 is defined as the top of an interface between the conductive plug 30 and the molding compound 20. From a top view perspective, the top meeting joint 25 is a line or border that separates the conductive plug 30 and the molding compound 20. The top meeting join 25 surrounds the conductive plug 30. By adding a film or layer on the top meeting joint 25, the added film or layer, the conductive plug 30 and the molding compound form a triple interface. When the added film or layer is the same material as the conductive plug 30, the interface formed with the molding compound is an angled interface of two materials at the top meeting joint 25.

A conductive pillar 45 is disposed on the top surface of the bond pad 154. At one end of the conductive pillar 45, the conductive pillar 45 is electrically connected to the bond pad 154 of the semiconductor chip 15. At the other end of the conductive pillar 45, the conductive pillar 45 is electrically connected with an interconnect. The conductive pillar 45 is formed with gold, silver, copper, nickel, tungsten, aluminum, palladium and/or alloys thereof. Formation of the conductive pillar 45 can be by a process such as evaporation, electroplating, vapor deposition, sputtering or screen printing.

Interconnects such as some redistribution layers (RDL) 471 and 472 are included in the semiconductor structure 10. In some embodiments as in FIG. 1, the RDL 471 and 472 each includes a seed layer 480. The RDL is an electrical connection to and/or between the semiconductor chip 15 and an external circuit. In FIG. 1, the RDL 471 is electrically connected with the conductive pillar 45 at one end. At the other end of the RDL 471, the RDL 471 is electrically connected with the RDL 472. The interconnects such as RDL 471 and 472 are formed with gold, silver, copper, nickel, tungsten, aluminum, palladium and/or alloys thereof.

An under bump metallurgy (UBM) 48 is placed on a top surface of the semiconductor structure 10. The UBM 48 has a bottom portion and the bottom portion is electrically connected with one end of the RDL 472. The UBM 48 has a top surface 482, which receives a solder ball or a solder paste. In some embodiments, the UBM 48 is formed with gold, silver, copper, nickel, tungsten, aluminum, palladium and/or alloys thereof.

Referring to FIG. 1, a cover 40 is located over the top meeting joint 25 and disposed on the conductive plug 30 and over the molding compound 20. The cover 40, the conductive plug 30 and the molding compound 20 form a triple interface. The cover 40 includes an extension 42, which represents a portion of the cover 40 that is overlaid on the top surface 23 of the molding compound 20. A length d of the extension 42 is measured from the top meeting joint 25 to an end 421 of the extension 42. In some embodiments, the length d of the extension 42 is approximately equal to 2.5 μm. In some embodiments, the length d of the extension 42 is greater than 2.5 μm. In some embodiments, the length of the extension 42 is greater than 7.5 μm.

For some embodiments, as in FIG. 1, the cover 40 includes two extensions 42 in a cross section. The extensions 42 are arranged symmetrically to the conductive plug 30, i.e. each extension 42 travels along the top surface 23 of the molding compound 20 for a same distance. In some embodiments with two extensions, an extension on one side of a conductive plug is longer than another extension. In some embodiments, a cover is electrically conductive. The cover is formed with gold, silver, copper, nickel, tungsten, aluminum, palladium and/or alloys thereof. In some embodiments, a cover is not electrically conductive. The cover is formed with silicon oxide, silicon nitride, or silicon oxynitride. In some embodiments, a cover is formed with a rubber or a polymer material such as epoxy, polyimide, polybenzoxazole (PBO), and the like.

A dielectric stack is formed in a 3D semiconductor structure in order to provide electrical isolations between conductive elements or interconnects. The dielectric stack also protects the internal structures being exposed to ambient conditions. For some embodiments, as in FIG. 1, a dielectric stack 50 has three different layers, a first dielectric 501, a second dielectric 502, and a third dielectric 503. The first dielectric 501 is formed on the semiconductor chip 15 with a polymer material such as epoxy, polyimide, polybenzoxazole (PBO), solder resist (SR), ABF film, and the like. In some embodiments, the first dielectric 501 isolates the semiconductor chip 15 and the RDL 471. In some embodiments, the first dielectric is a stress buffer between the passivation 152 and the second dielectric 502.

The second dielectric 502 is on the first dielectric 501 and the molding compound 20. The second dielectric 502 isolates the RDL 471 and the RDL 472. The second dielectric 502 has a through structure 512. The RDL 472 is electrically connected with the RDL 471 in the through structure 512. The second dielectric 502 is formed with a polymer material such as epoxy, polyimide, polybenzoxazole (PBO), SR, ABF film and the like. The second dielectric 502 can be also formed with dielectric materials, such as spin-on glass (SOG), silicon oxide, silicon oxynitride, or the like, by any suitable method such as spin coating or vapor deposition. For some embodiments as in FIG. 1, the second dielectric 502 is also on the cover 40 and the RDL 471.

The third dielectric 503 is formed on the second dielectric 502 and the RDL 472 with a polymer material such as epoxy, polyimide, polybenzoxazole (PBO), SR, liquid molding material and the like. The third dielectric 503 protects the RDL 472 from being exposed to ambient conditions. The third dielectric 503 has a through structure 513. The UBM 48 is formed in the through structure 513 and electrically connected with the RDL 472. The third dielectric 503 can be also formed with dielectric materials, such as spin-on glass (SOG), silicon oxide, silicon oxynitride, or the like, by any suitable method such as spin coating or vapor deposition. In FIG. 1, the cover 40 separates the second dielectric 502 from the top meeting joint 25. In some embodiments, the cover 40 also separates the second dielectric 502 from a triple interface. The triple interface is between the cover 40, the conductive plug 30 and the molding compound 20. If there is any crack generated at the meeting joint 25, the cover 40 can prevent the crack propagating into the second dielectric 502.

In some embodiments, the CTE of the conductive plug 30 is between about $5\times10^{-6}$ m/m K and $20\times10^{-6}$ m/m K, and the CTE of the molding compound 20 is between about $5\times10^{-6}$ m/m K and $75\times10^{-6}$ m/m K. If a thermal cycle is applied on the 3D semiconductor structure 10, a crack may generate at the top meeting joint 25 due to CTE mismatch between the conductive plug 30 and the molding compound 20. The cover 40 on the top meeting joint 25 provides a barrier for the semiconductor structure so that the crack can not propagate from the top meeting joint 25 into the second dielectric 502.

Figure 2A:
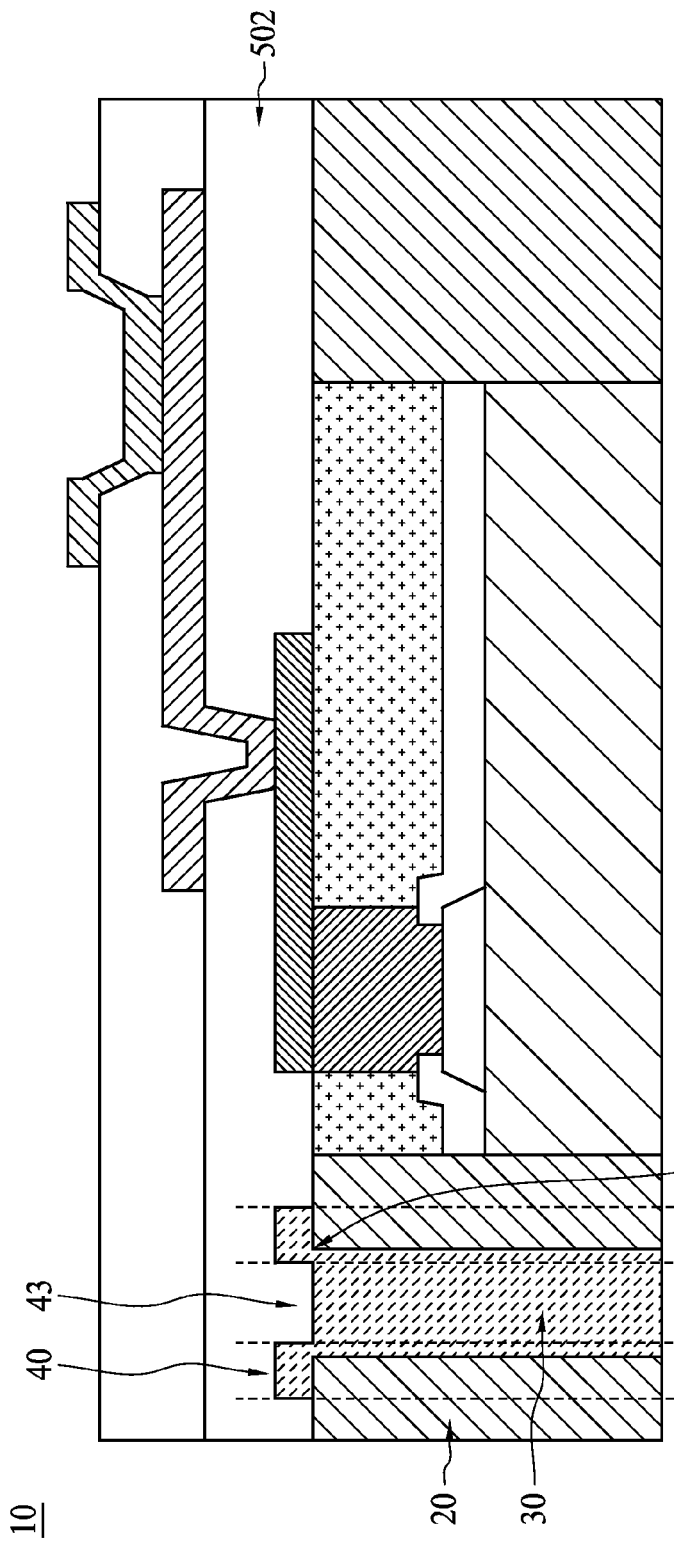
FIG. 2A-2B respectively represents a semiconductor structure including a molding compound and a conductive plug from different perspective views.
Figure 2B:
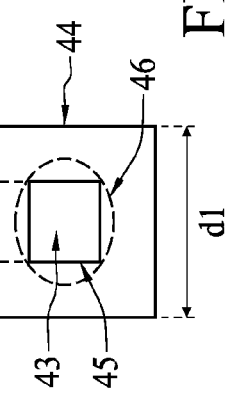

According to various embodiments, a cover or a divider in a 3D semiconductor structure is designed to prevent crack propagation. In some embodiments, the cover is a plate covering on a top meeting joint between a molding compound and a conductive plug. In some embodiments, the cover is a loop or ring. Referring to FIG. 2A, a semiconductor structure 10 includes a molding compound 20 and a conductive plug 30. The conductive plug 30 is in the molding compound 20. Sidewalls of the conductive plug 30 are surrounded by the molding compound 20. An interface is between the molding compound 20 and the conductive plug 30. A top meeting joint 25 is at the top of the interface. From a top view perspective, the top meeting joint 25 is a line or border that separates the conductive plug 30 and the molding compound 20. A cover 40 is over the top meeting joint 25 and on a portion of the conductive plug 30. The cover 40 is also on a portion of the molding compound 20. FIG. 2B is a top view of the cover 40. The cover 40 is a loop and has an inner edge 45 and an outer edge 44. A dotted line 46 is between the inner edge 45 and the outer edge 44. The dotted line 46 represents the top meeting joint 25. A cavity 43 is inside the inner edge 45. The cavity 43 is filled with the second dielectric 502. The outer width of cover 40 is d1 and the width of the cavity 43 or the inner edge 45 is d2. In some embodiments, half of the difference between the cover outer width and the cavity or the inner edge width is greater than 2.5 μm, i.e. $(d1-d2)/2>2.5$ μm. In other words, the thickness of the loop, distance from the outer edge to the inner edge, is greater than about 3 μm. In some embodiments, the difference between the outer edge width and the cavity width is greater than 15 μm, i.e. $d1-d2>15$ μm.

Figure 3A:
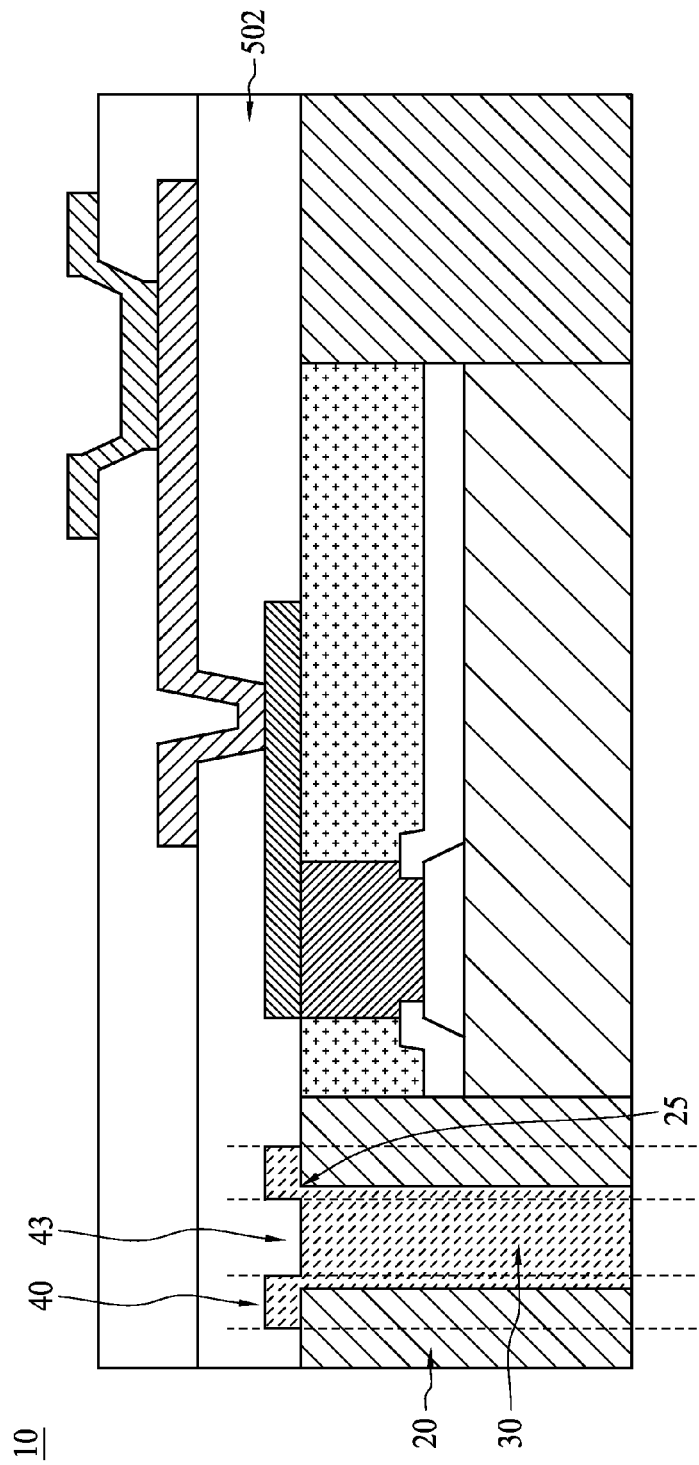
FIG. 3A-3B respectively represents a semiconductor structure including a molding compound and a conductive plug from different perspective views.
Figure 3B:
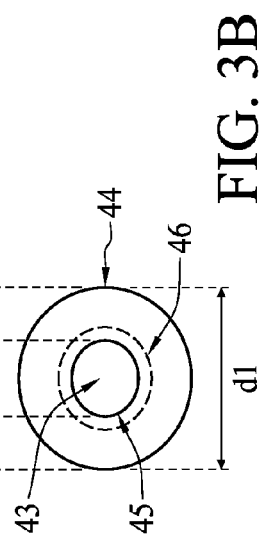

For some embodiments as in FIG. 3A, the cover 40 has a ring shape. The cover 40 is on a top meeting joint 25, on a portion of the conductive plug 30 and a portion of the molding compound 20. FIG. 3B is a top view of the cover 40. The cover 40 has an inner edge 45 and an outer edge 44. A dotted line 46 is between the inner edge 45 and the outer edge 44. The dotted line 46 represents the interface between the conductive plug 30 and the molding compound 20. A cavity 43 is inside the inner edge 45. The cavity 43 is filled with a second dielectric 502. For the cover 40, the outer width of cover 40 is d1 and the width of the cavity 43 or the inner edge 45 is d2. In some embodiments, half of the difference between the outer width d1 and the cavity or inner edge width d2 is greater than 2.5 μm, i.e. $(d1-d2)/2>2.5$ μm. In some embodiments, the difference between the outer width d1 and the cavity or inner edge width d2 is greater than 15 μm, i.e. $d1-d2>15$ μm.

In some embodiments, the cover 40 is a polygonal ring. In some embodiments, the cover 40 is a triangular ring. In some embodiments, the cover 40 is a quadrilateral shaped ring. In some embodiments, the meeting joint is between an outer edge and an inner edge of the polygonal ring. The polygonal ring also has a cavity inside and the cavity is inside the meeting joint.

In some embodiments, a cover is not in direct contact with molding compound and a conductive plug. The cover is over a meeting joint where the molding compound and the conductive plug interfaces. A crack generated at the meeting joint can only extend underneath the cover. The crack can not propagate into any other regions above the cover.

Figure 4:
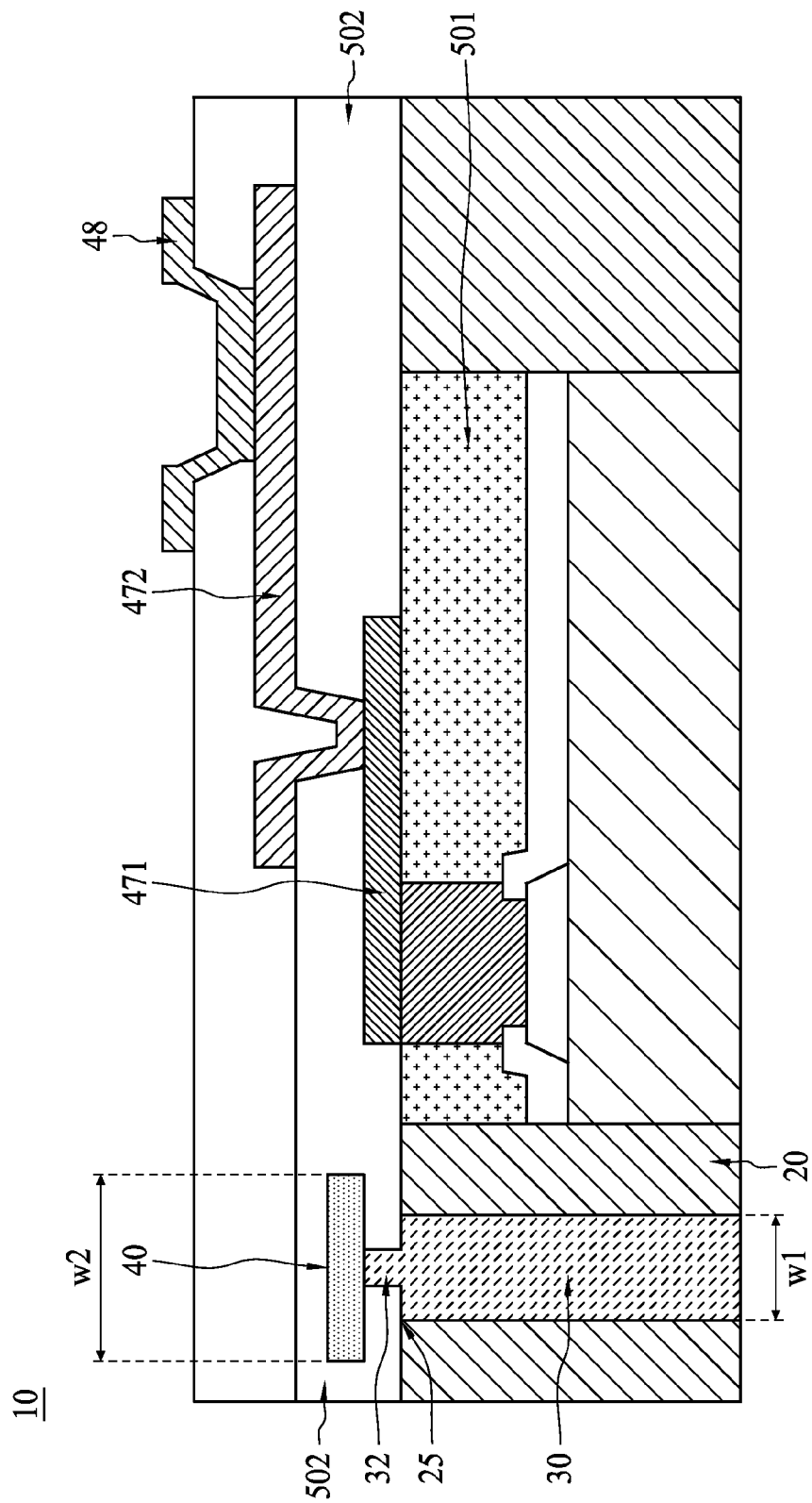
FIG. 4 is a three dimensional semiconductor structure configured as an integrated package.

In FIG. 4, according to some embodiments of the present disclosure, a semiconductor structure 10 is a 3D semiconductor package. The 3D semiconductor package 10 has a molding compound 20 surrounding a conductive plug 30. There is a top meeting joint 25 on the top of the interface between the molding compound 20 and the conductive plug 30. From a top view perspective, the top meeting joint 25 is a line or border that separates the conductive plug 30 and the molding compound 20. The width of the conductive plug is $w_1$. In some embodiments, the width $w_1$ is the diameter of the conductive plug 30. A second dielectric 502 is on the conductive plug 30. A cover 40 is on the second dielectric 502 and over the top meeting joint 25. The cover 40 has a width $w_2$. The width $w_2$ of the cover 40 is greater than the width $w_1$ of the conductive plug, i.e. $w_2>w_1$. In some embodiments, $w_2-w_1$ is approximately equal to 5 μm. In some embodiment, $w_2-w_1$ is greater than 5 μm. In some embodiment, $w_2-w_1$ is greater than 15 μm. A raised portion 32 is on the conductive plug 30 and supports the cover 40. The raised portion 32 is connected with the conductive plug 30 at one end and connected with the cover 40 at the other end. In some embodiments, the cover 40 is formed during a same step of forming an RDL 472. In some embodiments, the raised portion 32 is formed at the same step of forming an RDL 471. In some embodiments, the raised portion 32 is electrically conductive.

Figure 5:
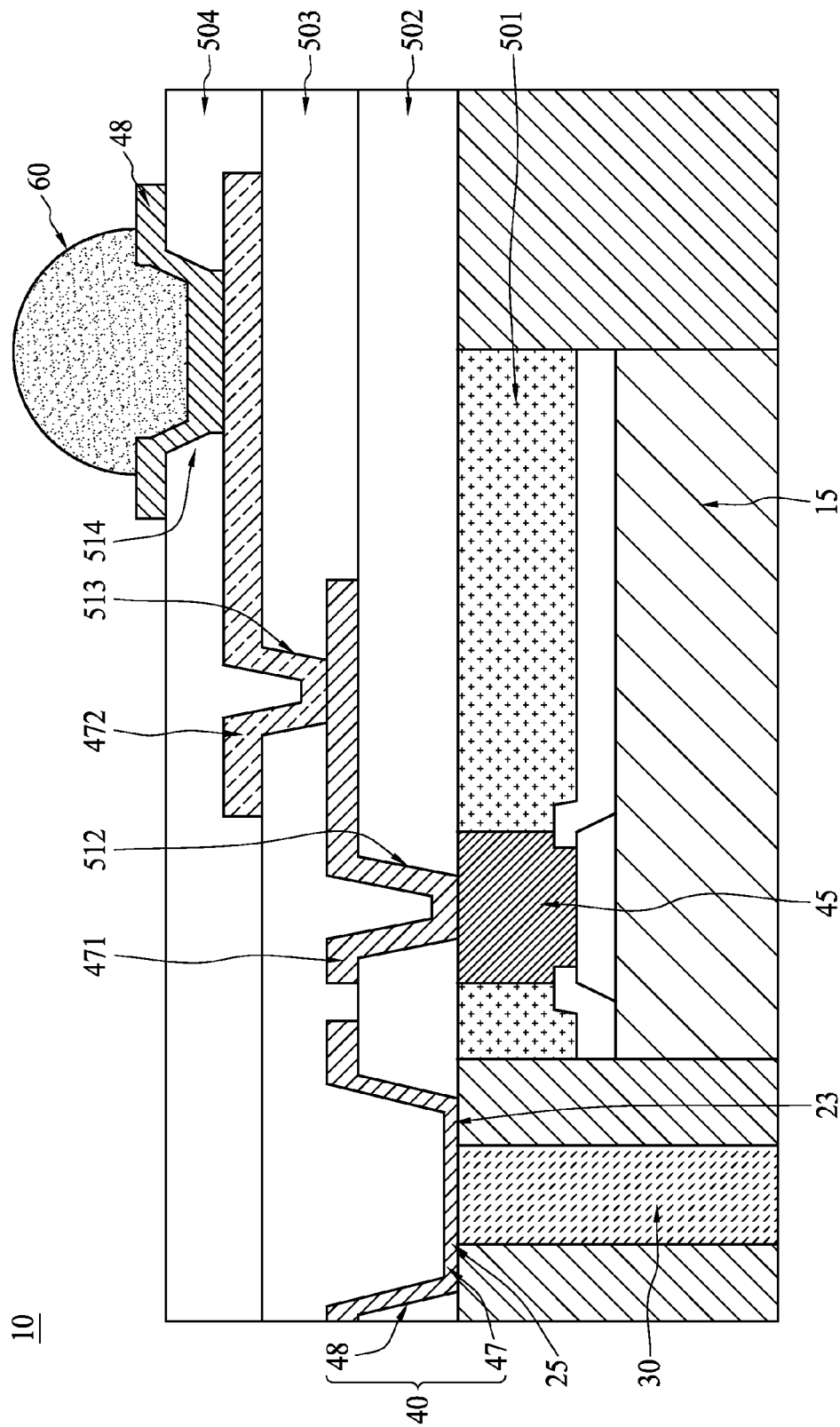
FIG. 5 is a three dimensional semiconductor structure with a through filled-via.

In some embodiments, a cover or a divider is a part of an RDL. The cover or divider provides electrical connections to and/or between a through conductive plug, formed by filling a via, and an external circuit. Referring to FIG. 5, a 3D semiconductor structure 10 has a filled-via 30. The filled-via 30 is formed with gold, silver, copper, nickel, tungsten, aluminum, and/or alloys thereof. The filled-via 30 is in a molding compound 20 and has two ends. One end is connected to a cover 40 and the other end is connected with an external circuit located at the bottom surface of the semiconductor structure 10. In certain embodiments, one end of the filled-via 30 is connected to the cover 40 and the other end is connected with an external circuit located at a buffer layer. The buffer layer is disposed on the bottom surface of the semiconductor structure 10. The cover 40 is on a top meeting joint 25 and has two sections. A first section 47 substantially runs along a top surface 23 of the molding compound 20. The first section 47 is over the top meeting joint 25 and has an extension on the molding compound 20. The minimum coverage of the extension on the molding compound 20 for each side is at least 2.5 μm. The cover 40 has a second section 48. The second section 48 substantially runs along sidewalls of a second dielectric 502. The cover 40 is formed during the same operation of forming an RDL 471. In some embodiments, the cover 40 is also a part of an RDL.

The 3D semiconductor structure 10 has four dielectric layers. A first dielectric 501 is disposed on a semiconductor chip 15. The first dielectric 501 is a polymer material such as epoxy, polyimide, polybenzoxazole (PBO), SR, ABF film and the like. The first dielectric 501 isolates the semiconductor chip 15 and the RDL 471. The second dielectric 502 is formed on the first polymer layer 501, the molding compound 20 and a conductive pillar 45 with a polymer material such as epoxy, polyimide, polybenzoxazole (PBO), SR, ABF film and the like. The second dielectric 502 can be also formed with dielectric materials, such as spin-on glass (SOG), silicon oxide, silicon oxynitride, or the like, by any suitable method such as spin coating or vapor deposition. An RDL 471 is formed on the second dielectric 502. The second dielectric 502 has a through structure 512. A part of the RDL 471 is formed on the sidewalls of the through structure 512. The RDL 471 is connected with a conductive pillar 45 at one end.

A third dielectric 503 may be a polymer material or a deposited dielectric material. A third dielectric 503 may be formed on the second polymer layer 502 and the RDL 471 with a polymer material such as epoxy, polyimide, polybenzoxazole (PBO), SR, ABF film and the like. The third dielectric 503 may be formed with dielectric materials, such as spin-on glass (SOG), silicon oxide, silicon oxynitride, or the like, by any suitable methods such as spin coating, laminating or vapor deposition. The third dielectric 503 isolates the RDL 471 and the RDL 472. An RDL 471 is connected with an RDL 472 using a through structure 513 in the third dielectric 503. A through structure 513 connects an RDL 471 and RDL 472. The RDL 472 is formed on the third dielectric 503. The through structure 513 of the third dielectric 503 provides sidewalls for the formation of the RDL 472 in order to have a connection with the RDL 471.

The fourth dielectric 504 is formed on the third polymer layer 503 and the RDL 472. The fourth dielectric 504 is formed with a polymer material such as epoxy, polyimide, polybenzoxazole (PBO), SR (solder resist), ABF film, liquid molding material and the like. The fourth dielectric 504 can be also formed with dielectric materials, such as spin-on glass (SOG), silicon oxide, silicon oxynitride, or the like, by any suitable method such as spin coating, laminating, compress molding, or vapor deposition. The fourth dielectric 504 protects the RDL 472 being exposed to the ambient conditions. The fourth dielectric 504 has a through structure 514. A UBM 48 is disposed on the through structure 514 and connected with the RDL 472. The fourth dielectric 504 protects the RDL 472 from being exposed to the ambient conditions.

A solder ball 60 is disposed on the UBM 48. The solder ball 60 is mounted on the top surface of the UBM 48 and is electrically connected with an external circuit. In some embodiments, the solder ball 60 is a solder paste.

Figure 6A:
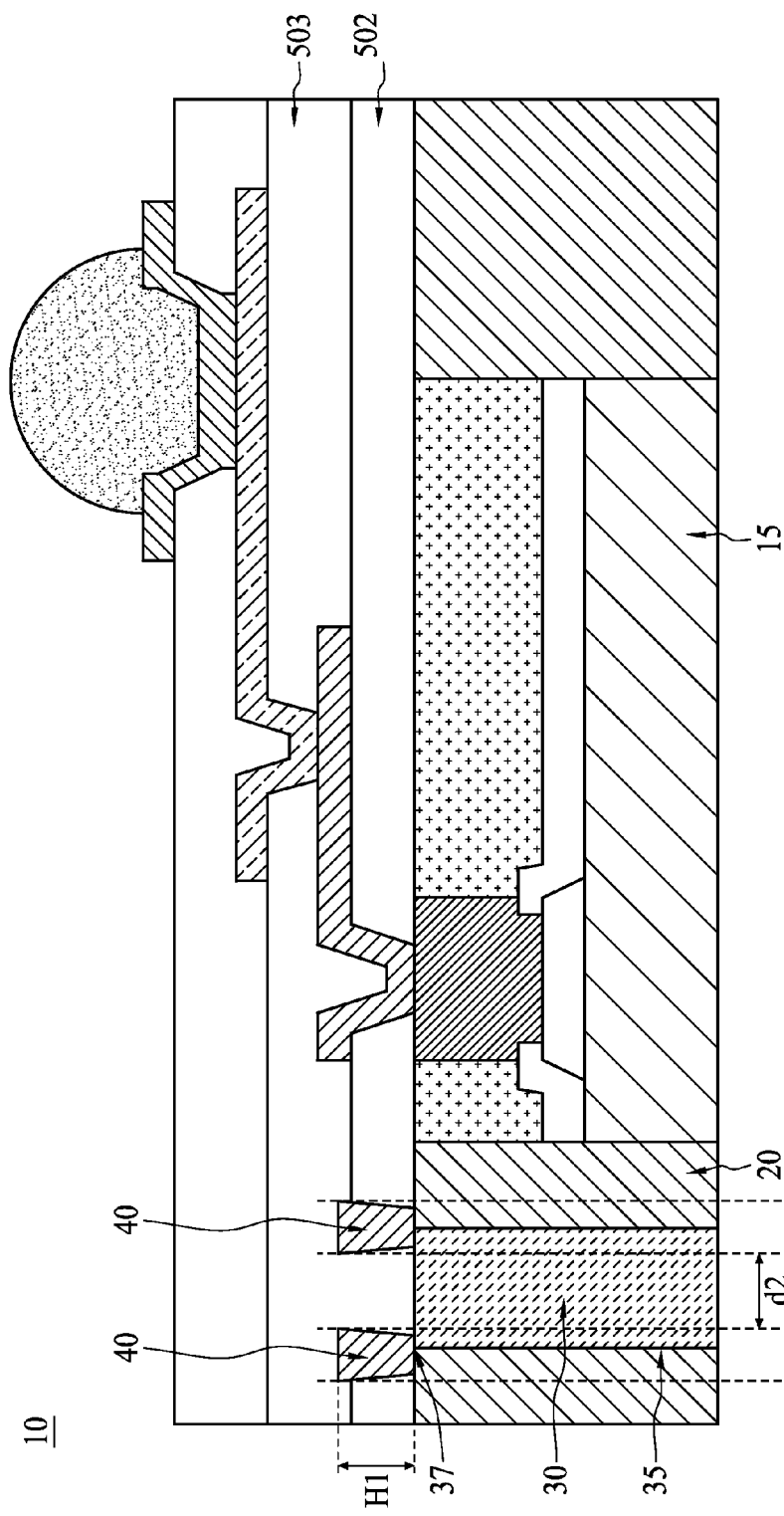
FIG. 6A-6B respectively represents a three dimensional semiconductor package configured to have a divider on the molding compound from different perspective views.

Referring to FIG. 6A, according to some embodiments of the present disclosure, a 3D semiconductor package 10 has a molding compound 20. The molding compound 20 is adjacent to a semiconductor chip 15. A filled-via 30 is in the molding compound 20. The filled-via 30 is a through via inside the molding compound 20. An interface 35 is between the molding compound 20 and the filled-via 30. A second dielectric 502 is on the molding compound 20 and the filled-via 30. A divider 40 is located over the interface 35. The divider 40, the molding compound 20 and the filled-via 30 together form a triple interface 37. In some embodiments, the filled-via 30 has a linear temperature expansion coefficient ranging from $4 \times 10^{-6}$ m/m K to $20 \times 10^{-6}$ m/m K. The molding compound 20 has a linear temperature expansion coefficient ranging from $30 \times 10^{-6}$ m/m K to $100 \times 10^{-6}$ m/m K. Difference in the temperature expansion coefficient between the molding compound 20 and the filled-via 30 is significant. To avoid any crack propagating into the second dielectric 502. The divider 40 separates the triple interface 37 from the second dielectric 502.

Figure 6B:
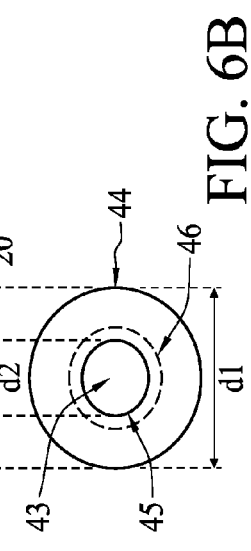

For some embodiments as in FIG. 6A, the divider 40 has a height H1 extending substantially along the axial direction of the filled-via 30. FIG. 6B is the top view of the divider 40. From the top view perspective, the divider 40 is a loop. In some embodiments, the divider 40 is a quadrilateral loop. In some embodiments, the divider is a triangle loop. In some embodiments, the divider is a ring. The cover 40 has an inner edge 45 and an outer edge 44. A dotted line 46 represents the interface between the conductive plug 30 and the molding compound 20. A cavity 43 is inside the inner rim 45. The cavity 43 is filled with the second dielectric 502. The width of the outer edge is d1 and the width of the inner edge is d2. In some embodiments, half of the difference between the outer edge width d1 and the inner edge width d2 is greater than 2.5 µm, i.e. (d1−d2)/2>2.5 µm. In some embodiments, the difference between the outer edge width and the inner edge width is greater than 15 µm i.e. d1−d2>15 µm.

Because of CTE mismatch, an interface between a filled-via and a molding compound has high stress. By arranging a cover or a divider on the interface, the stress experienced by the dielectric layers over the filled via is reduced. According to simulation results, the stress measured over the interface is substantially equivalent to the stress measured at the center of the plug. In some embodiments, the stress measured at the interface is about 5% to 10% greater than the stress measured at the center of the plug when the cover or divider is used. Without a cover or a divider, the stress measured at the interface is about 50% or greater than the stress measured at the center of the plug.

A method of manufacturing a 3D semiconductor structure and the semiconductor structure has a cover or divider to prevent a crack propagating into a dielectric layer. The method includes a number of operations and the description and illustration are not deemed as a limitation as the order of the operations.

A term "patterning" or "patterned" is used in the present disclosure to describe an operation of forming a predetermined pattern on a surface. The patterning operation includes various steps and processes and varies in accordance with the features of embodiments. In some embodiments, a patterning operation is adopted to pattern an existing film or layer. The patterning operation includes forming a mask on the existing film or layer and removing the unmasked film or layer with an etch or other removal process. The mask is a photo resist, or a hardmask. In some embodiments, a patterning operation is adopted to form a patterned layer directly on a surface. The patterning operation includes forming a photosensitive film on the surface, conducting a photolithography process and a developing process. The remaining photosensitive film is retained and integrated into the 3D semiconductor structure.

A term "plating" or "plated" is used in the present disclosure to describe an operation of forming a film or a layer on a surface. The plating operation includes various steps and processes and varies in accordance with the features of embodiments. The film or layer been plated on the surface is a single film or a composite stack. In some embodiments, a plating operation is adopted to form a metallic film. In some embodiments, a plating operation includes forming a seed layer and electroplating a metallic film on the seed layer. In some embodiments, a plating operation is a vapor deposition process. In some embodiments, a plating operation is a sputtering process.

A term "filling" or "filled" is used in the present disclosure to describe an operation of forming material in a hole. The filling operation includes various steps and processes and varies in accordance with the features of embodiments. In some embodiments, a filling operation includes forming a conductive material in a hole. In some embodiments, a filling operation includes forming a liner on the sidewalls of the hole and forming a conductive film on the liner. In some embodiments, a filling operation includes a electroplating process. In some embodiments, a filling operation includes a vapor deposition process. In some embodiments, a filling operation includes a sputtering process.

Figure 7A:
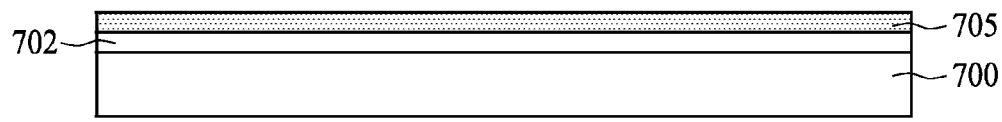
FIG. 7A-7H are operations of a method of manufacturing a three dimensional semiconductor structure.
Figure 7B:
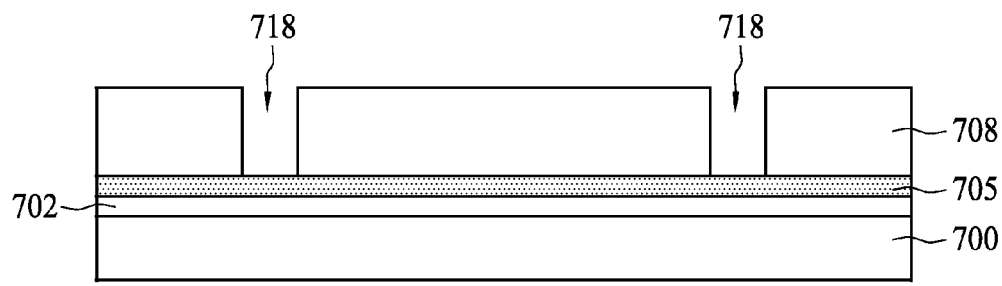

In FIG. 7A, a carrier 700 is provided to form a 3D semiconductor structure thereon. A polymer buffer layer 702 is formed on the top surface of the carrier 700. The polymer buffer layer 702 includes polyimide, PBO, SR, LTHC (light to heat conversion film), wafer backside coating tape, and ABF. In some embodiments, the polymer buffer 702 includes at least two layers with different materials. A seed layer 705 is formed on the top of the polymer buffer layer 702. The seed layer 705 is a single layer or a composite stack and formed with material such as cooper, titanium tungsten, tantalum, titanium/copper, or combination thereof. FIG. 7B is an operation of forming a patterned layer 708 on the seed layer 705. The patterned layer 708 has several holes 718.

Figure 7C:
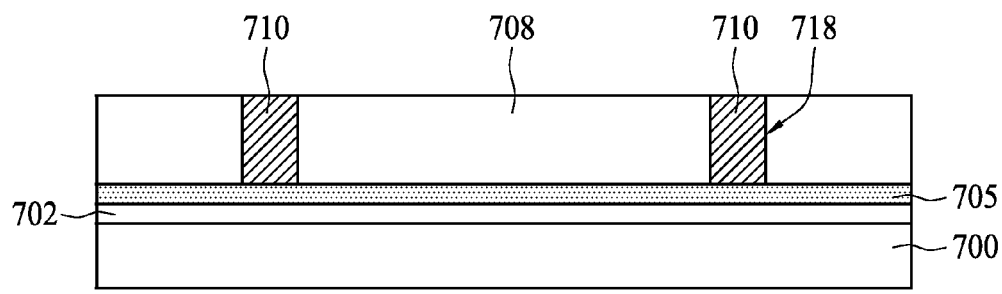
Figure 7D:
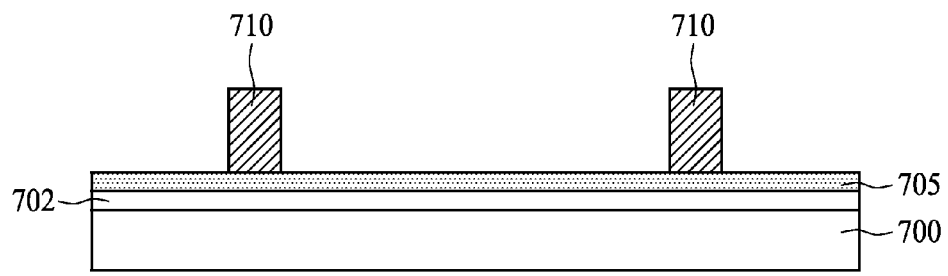
Figure 7E:
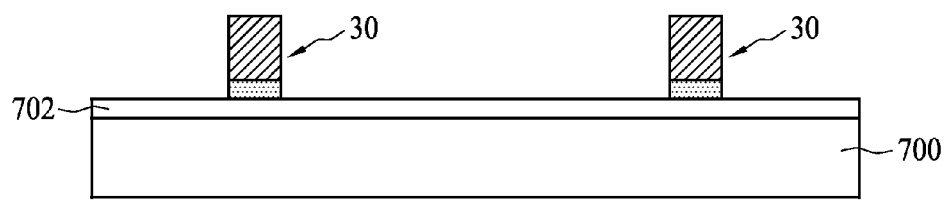

In FIG. 7C, a conductive material 710 is filled into the holes 718. In some embodiments, the conductive material 710 is filled with electroplating. In FIG. 7D, the patterned layer is removed and several conductive posts 710 remain on the seed layer 705. FIG. 7E is an operation of removing a portion of the seed layer. Several independent conductive plugs 30 are formed on the top surface of the carrier 700. Each conductive plugs 30 include a seed layer and a conductive post 710.

Figure 7F:
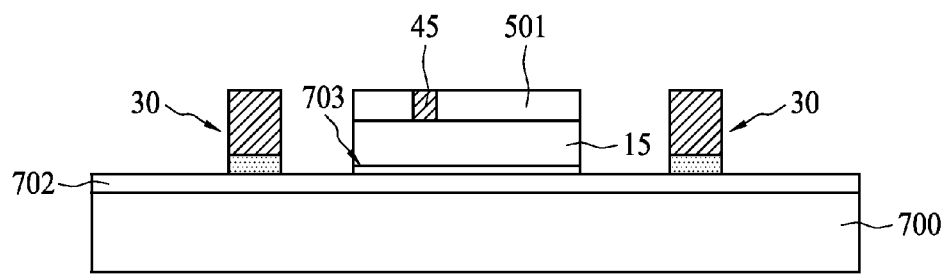

In FIG. 7F, a semiconductor chip 15 is placed on the carrier 700 and located between the conductive plugs 30. In some embodiments as shown in FIG. 7F, there is a die attachment film (DAF) 703 formed on the polymer buffer layer 703 before placing the semiconductor chip 15 on the carrier 700. The semiconductor chip 15 is covered by a first dielectric 501. A conductive pillar 45 is disposed on the semiconductor chip 15 in order to electrically communicate with an interconnect. In some embodiments, the first dielectric 501 is formed on the semiconductor chip 15 after placing on the carrier 700. In some embodiments, the first dielectric 501 and/or the conductive pillar 45 is pre-formed on the semiconductor chip 15 before placing the chip 15 on the carrier 700.

Figure 7G:
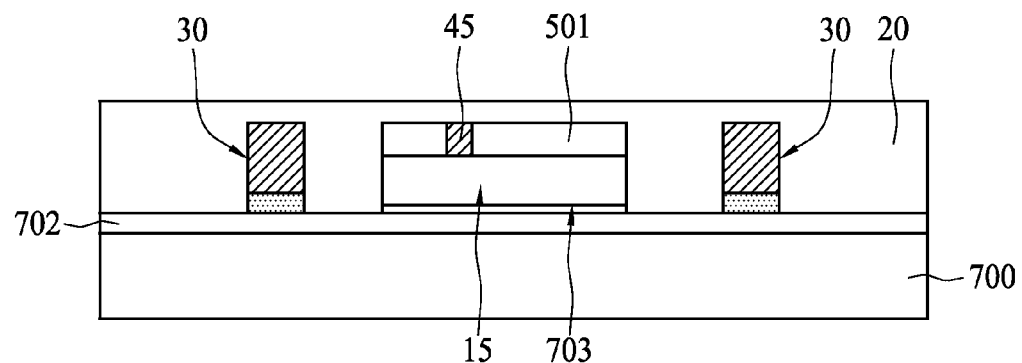

In FIG. 7G, a molding compound 20 is disposed on the carrier 700. The molding compound 20 covers the semiconductor chip 15, the first dielectric 501, the conductive pillar 45 and the conductive plugs 30. For some embodiments as in FIG. 7G, the molding compound 20 covers the top surface of the conductive plugs 30.

Figure 7H:
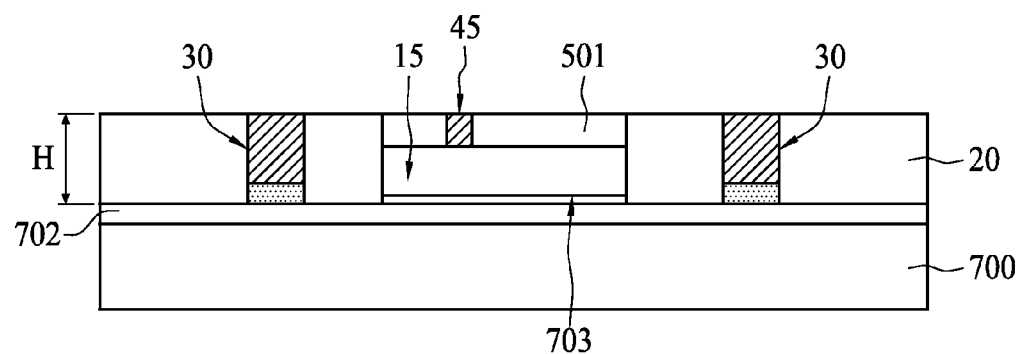

An operation of the method includes a grinding process to remove a portion of the molding compound. As in FIG. 7H, the thickness of the molding compound 20 is reduced to a predetermined height H in order to have the conductive pillar 45 exposed. In certain embodiments, the predetermined height H is between 50 µm and 250 µm. The height of the conductive plug 30 may be also reduced during the grinding process to have the top surface of the conductive plug 30 exposed.

Figure 8A:
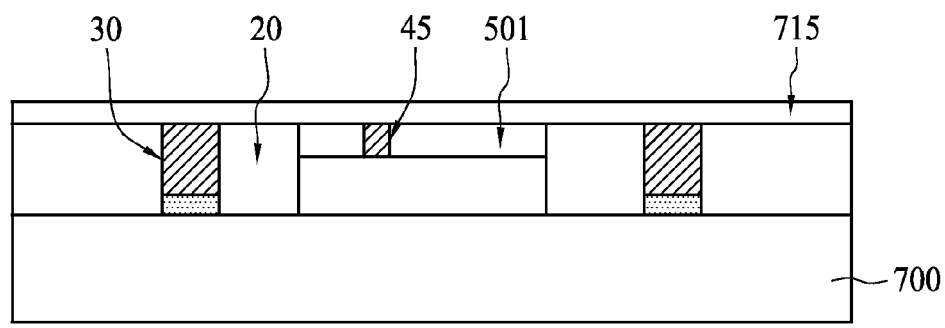
FIGS. 8A-8D are operations of a method of manufacturing a three dimensional semiconductor structure.

FIG. 8A-8D are the operations of forming a divider over a top meeting joint between a molding compound and a conductive according to some embodiments in the present disclosure. In FIG. 8A, a film 715 is disposed on a top surface of the molding compound 20. In some embodiments, thickness of the film 715 is between 1 µm and 20 µm. The film 715 is an electrically conductive material and is formed with gold, silver, copper, nickel, tungsten, aluminum, palladium and/or alloys thereof. In some embodiments, the film 715 is not electrically conductive and is formed with rubber or a polymer material such as epoxy, polyimide, polybenzoxazole (PBO), SR, ABF film and the like.

Figure 8B:
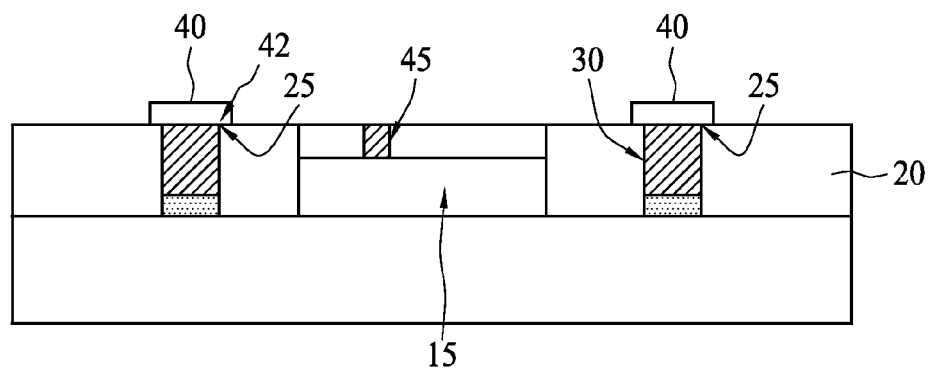

In FIG. 8B the film 715 is patterned to form dividers 40. The divider 40 is over a top meeting joint 25 between the molding compound 20 and the conductive plug 30. The divider 40 has an extension 42 extending from the top meeting joint 25 and covering a portion of the molding compound 20 top surface. In some embodiments, the extension 42 on the molding compound 20 top surface is about 2.5 µm.

Figure 8C:
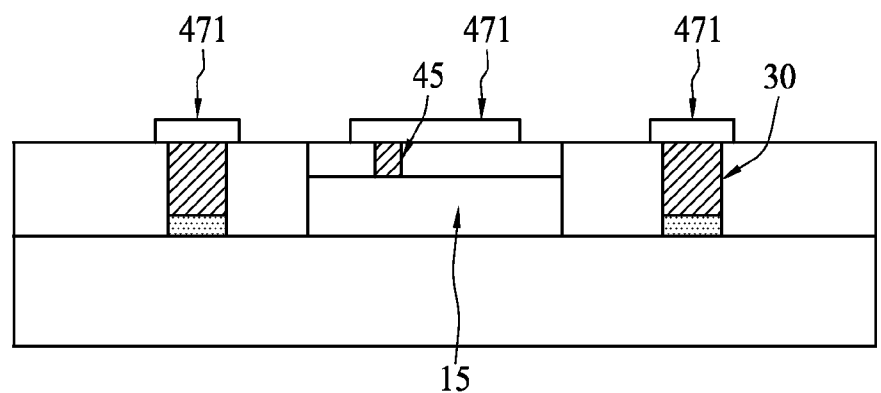
Figure 8D:
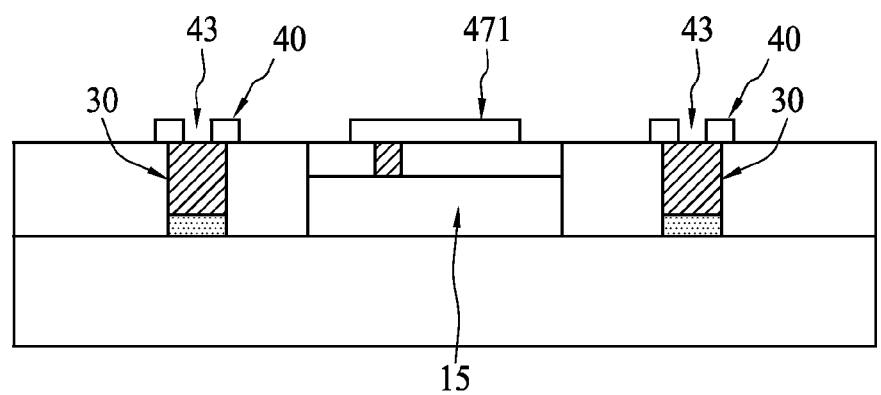

For some embodiments as in FIG. 8C, dividers 40 are formed with a same material for a redistribution layer (RDL) 471. The film 715 is patterned to form the RDL 471 and the dividers 40 during a same operation. In some embodiments, the divider 40 has a cavity 43 as in FIG. 8D.

Figure 9A:
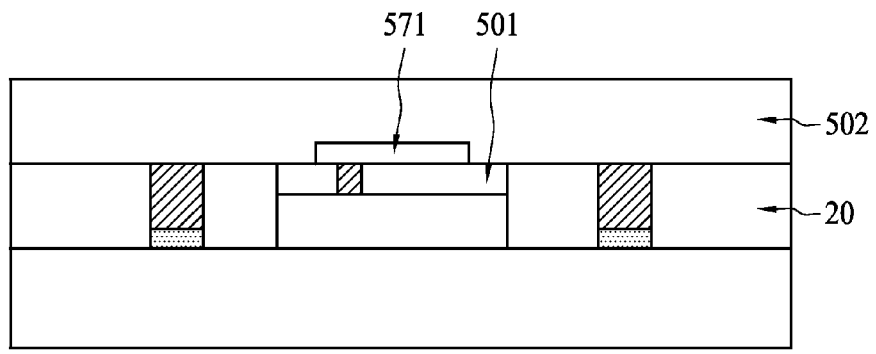
FIGS. 9A-9F are operations of a method of manufacturing a three dimensional semiconductor structure.

In some embodiments, a second dielectric is formed before forming a divider over a top meeting joint between a molding compound and a conductive plug. In FIG. 9A, a second dielectric 502 is formed on a molding compound 20 and a first dielectric 501. In some embodiments, the second dielectric 502 is formed with a material same as the first dielectric 501. In some embodiments, the second dielectric 502 and the first dielectric 501 are formed with a polymer material such as epoxy, polyimide, polybenzoxazole (PBO), SR, ABF film and the like. In some embodiments, the material for the second dielectric 502 is different from the first dielectric 501.

Figure 9B:
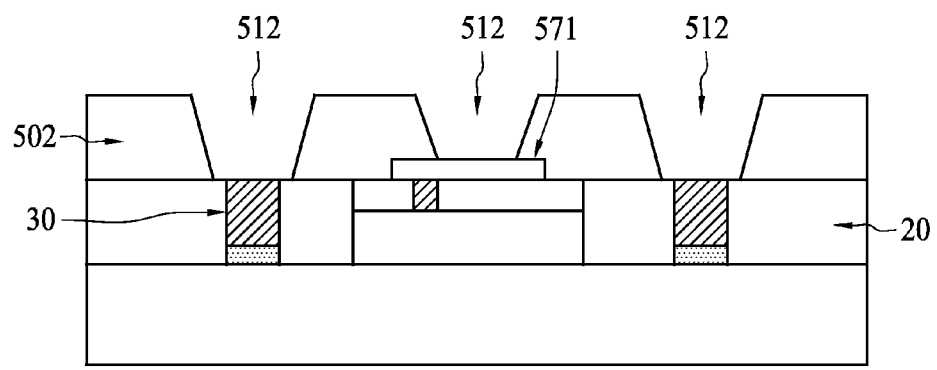
Figure 9C:
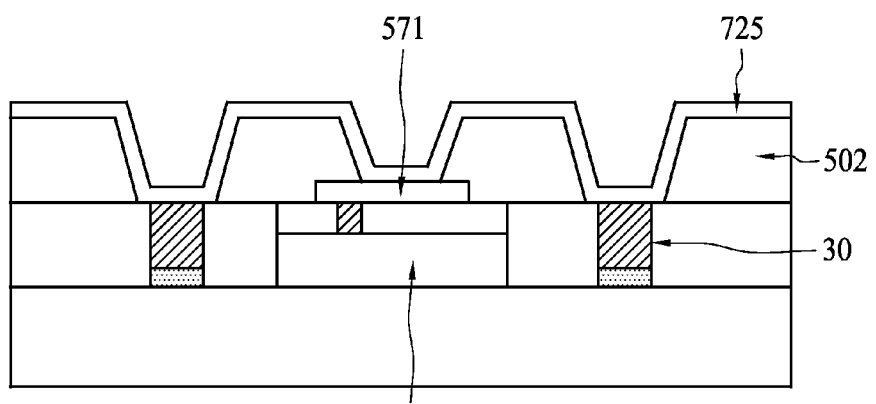
Figure 9D:
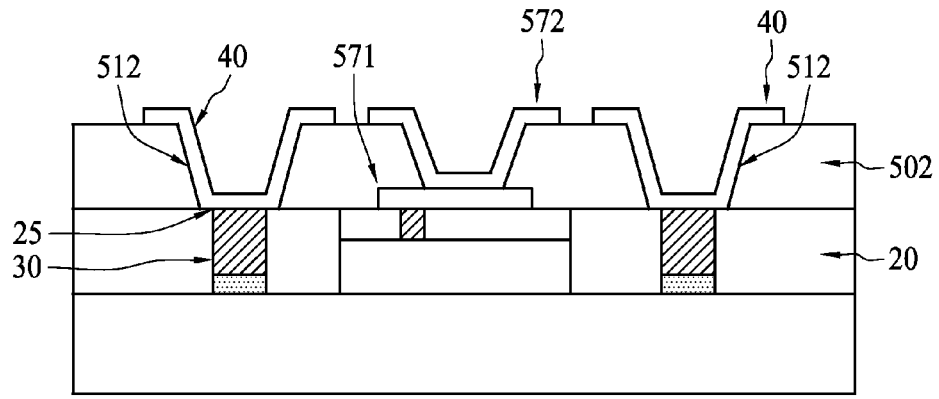

In FIG. 9B, the second dielectric 502 is patterned to have several through structures 512. Top surfaces of the conductive plug 30 and the RDL 571 are exposed at the bottom opening of the through structures 512. For a through structure arranged on a conductive plug, the diameter of the bottom opening of the thorough hole is larger than the diameter of the conductive plug. In FIG. 9C, a conductive film 725 is formed on the second dielectric 502, the conductive plugs 30 and the RDL 571. The conductive film 725 is patterned to have several sections as in FIG. 9D. The sections include several dividers 40 and an RDL 572. The dividers 40 are formed on the conductive plugs 30 and sidewalls of the through structures 512. Each divider 40 is over a top meeting joint 25 that the top meeting joint 25 is between the molding compound 20 and the conductive plug 30. In some embodiments, a divider is electrically connected to a conductive plug. The RDL 572 is formed on the RDL 571, sidewalls of the through structures 512 and on the second dielectric 502. The RDL 572 is electrically connected to the RDL 571. In some embodiments, a divider is also a part of the RDL.

Figure 9E:
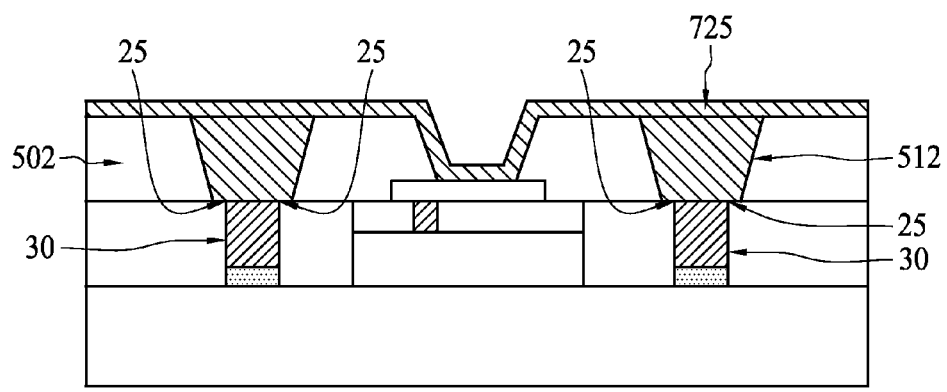
Figure 9F:
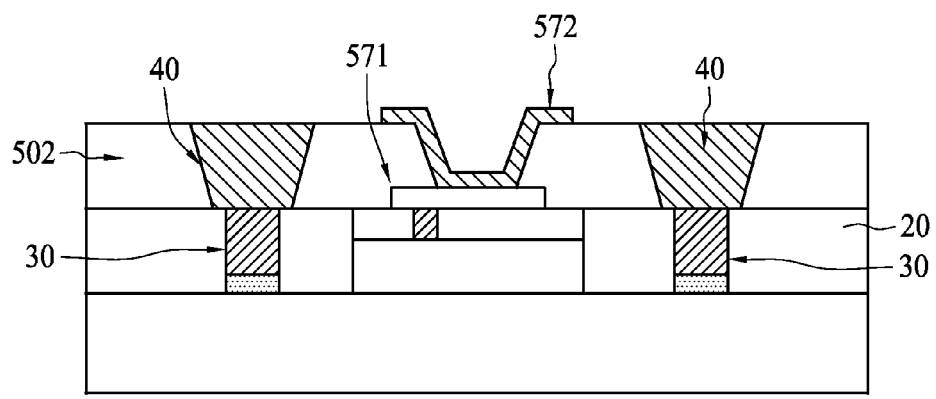

In some embodiments, the size of a though hole in the second dielectric is designed to form a pillar-type divider on a conductive plug. In FIG. 9E, through structures 512 on the conductive plugs are adjusted to be filled with a conductive film 725. The size of the through structure 512 is designed to be filled with the conductive film 725. The diameter of the bottom opening is larger than the diameter of the conductive plug 30. In FIG. 9F, a portion of the conductive film on the second dielectric 502 is removed. Several pillar-type dividers 40 are formed on the conductive plugs 30. An RDL 572 is formed on the RDL 571. The RDL 572 is connected with the RDL 571 at one end. In some embodiments, there are at least two pillar-like dividers on a conductive plug.

Figure 10A:
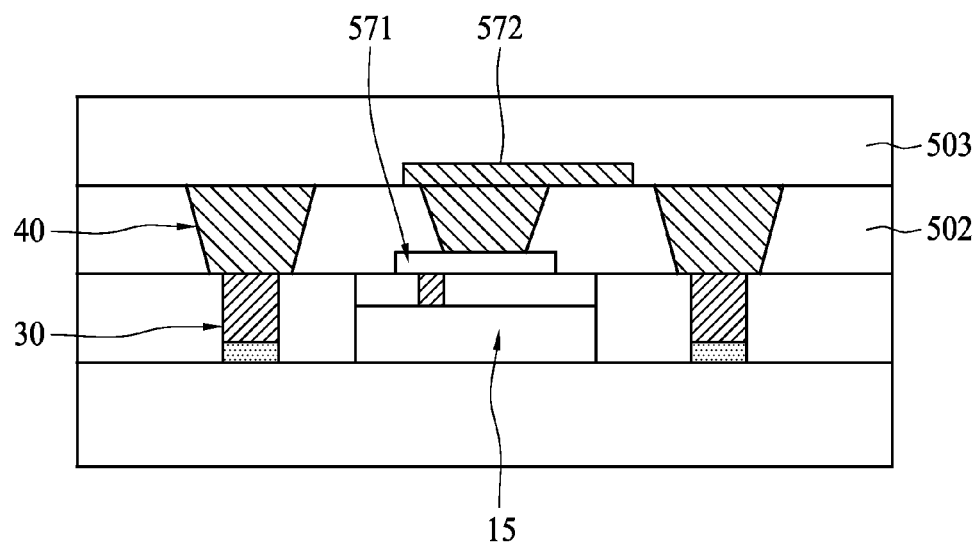
FIG. 10A-10B are operations of a method of manufacturing a three dimensional semiconductor structure.
Figure 10B:
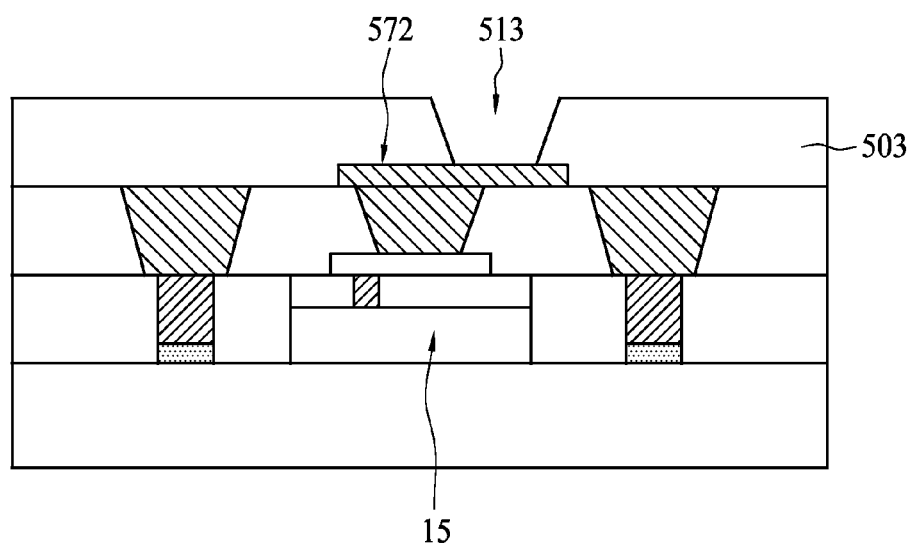

FIG. 10A represents some embodiments according to the present disclosure. In FIG. 10A, a third dielectric 503 is formed on a second dielectric 502. The third dielectric 503 is also on an RDL 572 and dividers 40. In some embodiments, the third dielectric 503 is formed with a different material from the second dielectric. In some embodiments, the third dielectric is formed with a polymer material such as epoxy, polyimide, polybenzoxazole (PBO), SR (solder resist), liquid mold material, ABF film and the like. In FIG. 10B, a through structure 513 is formed in the third dielectric 503. A portion of the top surface of the RDL 572 is exposed at the bottom opening of the through structure 513. The bottom opening is designed to have a UBM formed on the exposed portion of the RDL 572.

Figure 11:
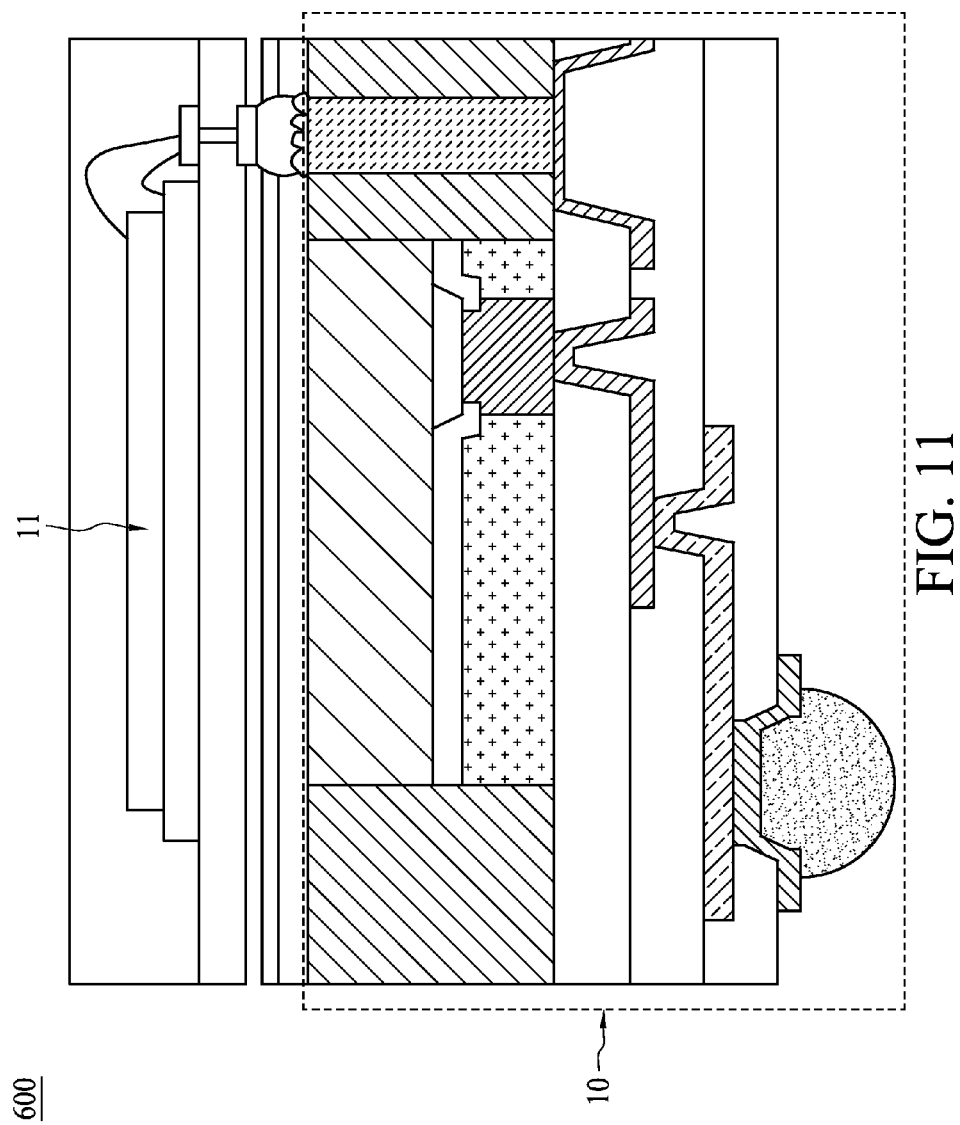
FIG. 11 is an integrated 3D IC package according to some embodiments of the present disclosure.

FIG. 11 is an integrated 3D IC package 600. The integrated 3D IC package 600 includes the 3D semiconductor structure 10 as in FIG. 5 and a memory chip 11. The memory chip 11 is electrically connect with the 3D semiconductor structure 10.

In some embodiments, there are more than three dielectrics formed in a 3D semiconductor structure. In some embodiments, there are more than two RDL formed in a 3D semiconductor structure.

In some embodiments, a semiconductor structure includes a molding compound, a conductive plug, and a cover. The conductive plug is in the molding compound. The cover is over a top meeting joint between the conductive plug and the molding compound. The semiconductor structure further has a dielectric. The dielectric is on the cover and the molding compound.

In some embodiments, a semiconductor 3D package includes a molding compound, a filled-via, and a dielectric. The filled-via is in the molding compound. The dielectric is on the molding compound. The semiconductor 3D package further includes a divider. The divider is on the molding compound. The divider, the filled-via and the molding form a triple interface. The divider separates the dielectric from the triple interface.

In some embodiments, a method of manufacturing a semiconductor structure includes forming a conductive plug on a substrate. The method also includes surrounding the sidewall of the conductive plug with a molding compound. The method also includes disposing a divider covering an upper top meeting point joint between the molding compound and the conductive plug.

The methods and features of this invention have been sufficiently described in the above examples and descriptions. It should be understood that any modifications or changes without departing from the spirit of the invention are intended to be covered in the protection scope of the invention.

What is claimed is:

1. A semiconductor structure, comprising:
   a molding compound;
   a conductive plug in the molding compound;
   a cover over a top meeting joint between the conductive plug and the molding compound;
   a dielectric on the cover and over the molding compound; and
   a semiconductor chip and a first dielectric, wherein the first dielectric is on the semiconductor chip.

2. The semiconductor structure in claim 1, wherein the cover includes an extension with a length along a top surface of the molding compound.

3. The semiconductor structure in claim 2, wherein the length is at least greater than or equal to 2.5 μm.

4. The semiconductor structure in claim 1, wherein the cover is a redistribution layer (RDL).

5. The semiconductor structure in claim 1, wherein the cover is electrically conductive.

6. The semiconductor structure in claim 1, wherein the cover is not electrically conductive.

7. The semiconductor structure in claim 1, wherein the cover is a loop.

8. The semiconductor structure in claim 1 further comprising a cavity inside the cover.

9. A semiconductor structure, comprising:
   a molding compound;
   a conductive plug in the molding compound;
   a cover over a top meeting joint between the conductive plug and the molding compound, wherein the cover includes an inner edge and an outer edge and the difference between the outer edge and the inner edge is greater than 5 μm.

10. A semiconductor 3D package, comprising:
    a molding compound;
    a filled-via in the molding compound,
    a dielectric on the molding compound; and
    a divider on the molding compound, wherein the divider, the filled-via and the molding form a triple interface and the divider separates the dielectric from the triple interface.

11. The semiconductor 3D package in claim 10, wherein the divider has a CTE and the CTE of the divider is between a CTE of the filled-via and a CTE of the molding compound.

12. The semiconductor 3D package in claim 10, wherein the dielectric includes at least two different material layers.

13. The semiconductor 3D package in claim 10, wherein the divider extends along the axial direction of the filled-via.

14. The semiconductor 3D package in claim 10, wherein the divider is a loop.

15. The semiconductor 3D package in claim 14, wherein the divider includes an inner edge and an outer edge and the difference between the outer edge width and the inner edge width is greater than 5 μm.

16. The semiconductor 3D package in claim 10 further comprising a raised portion, wherein the raised portion is on the filled-via and under the divider.

17. A method of manufacturing a semiconductor structure, comprising:
    forming a conductive plug on a substrate;
    placing a semiconductor chip on the substrate;
    forming a first dielectric over the semiconductor chip;
    surrounding a sidewall of the conductive plug with a molding compound; and
    disposing a divider over a top meeting joint, wherein the top meeting joint is between the molding compound and the conductive plug.

18. The method in claim 17 further comprising forming a dielectric on the molding compound.

19. The method in claim 18 further comprising patterning the dielectric to include a through structure in the dielectric.

* * * * *